United States Patent [19]

Drusch

[11] 3,825,925

[45] July 23, 1974

[54] CONVERTER OF DIGITAL DATA INTO ANALOGUE DATA

[76] Inventor: Gaston Joseph Drusch, 38 Avenue Douglas Haig, Versailles, France

[22] Filed: Apr. 10, 1973

[21] Appl. No.: 349,864

[30] Foreign Application Priority Data

Apr. 10, 1972 France .............................. 72.12518

[52] U.S. Cl. .......................... 340/347 DA, 336/143

[51] Int. Cl. .......................... H04l 3/00, H03k 13/00

[58] Field of Search .............. 340/347 DA, 347 SY; 336/137, 143

[56] References Cited

UNITED STATES PATENTS

| | | | |
|---|---|---|---|
| 2,814,006 | 11/1957 | Wilde | 340/347 DA |
| 2,969,534 | 1/1961 | Fisher | 340/347 DA |
| 3,019,426 | 1/1962 | Gilbert | 340/347 DA |
| 3,102,258 | 8/1963 | Curry | 340/347 DA |
| 3,223,992 | 12/1965 | Bentley et al. | 340/347 DA |
| 3,426,345 | 2/1969 | Kase | 340/347 DA |

*Primary Examiner*—Thomas J. Sloyan

*Attorney, Agent, or Firm*—Imirie and Smiley

[57] ABSTRACT

The present device includes a number of networks each having an analogue output corresponding to the weight of a digital signal applied to an input terminal thereof. The inputs are connected to respective outputs of a digital source, and the outputs of the networks are connected in series for applying an analogue version of the complete digital input signal to a receiving device.

11 Claims, 8 Drawing Figures

CONVERTER OF DIGITAL DATA INTO ANALOGUE DATA

BACKGROUND OF THE INVENTION

The present invention relates to a converter of data in digital form into data in analogue form, and more particularly to a digital-to-analogue converter adapted to receive the binary output of a digital computer and to transform the binary number into a proportional a.c. voltage.

Many circuits are known in the art for making a transformation of signals from digital to analogue form. However, the known circuits are of a relatively elaborate design and of high cost, while the accuracy of the same is generally low. The present invention solves this problem in a particularly easy way.

SUMMARY OF THE INVENTION

According to the present invention, a device to convert digital data signals into an analogue data signal in the form of an alternating electrical voltage is composed of a number of elementary networks or cells equal to the number of fits of said digital signal, the cells being each connected to one output of the digital source for receiving each a bit of a given weight and for furnishing, in response to the received numerical data, an analogue alternating output voltage signal proportional to the weight of the digital input, the outputs of said cells being connected in series whereby an alternating voltage which is an analogue representation of said digital expression is provided.

DETAILED DESCRIPTION OF THE INVENTION

Figure 1:
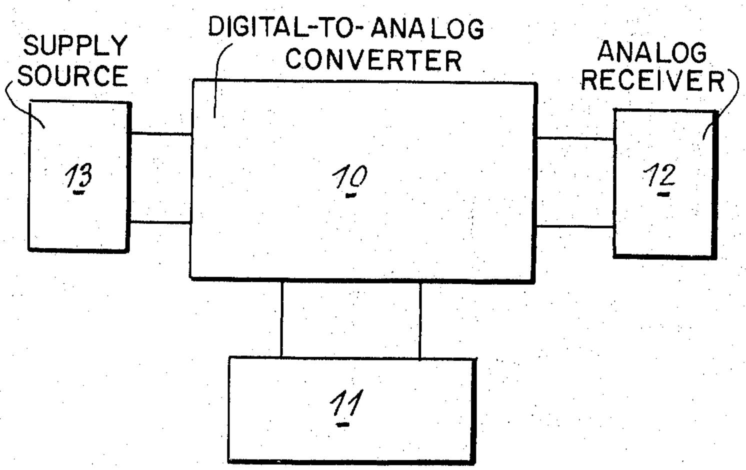
FIG. 1 is a block diagram of an installation including a digital-to-analogue converter according to the present invention.

In FIG. 1 is shown in a very diagrammatic way an installation embodying the digital-to-analogue converter of the present invention. The converter generally represented by reference number 10, receives data in digital or numerical form from a numerical output device 11, for example a computer, and sends data in analogue form to an analogue receiving apparatus 12. A supply source of alternating current 13 provides suitable operating potential for the converter 10.

Figure 2:
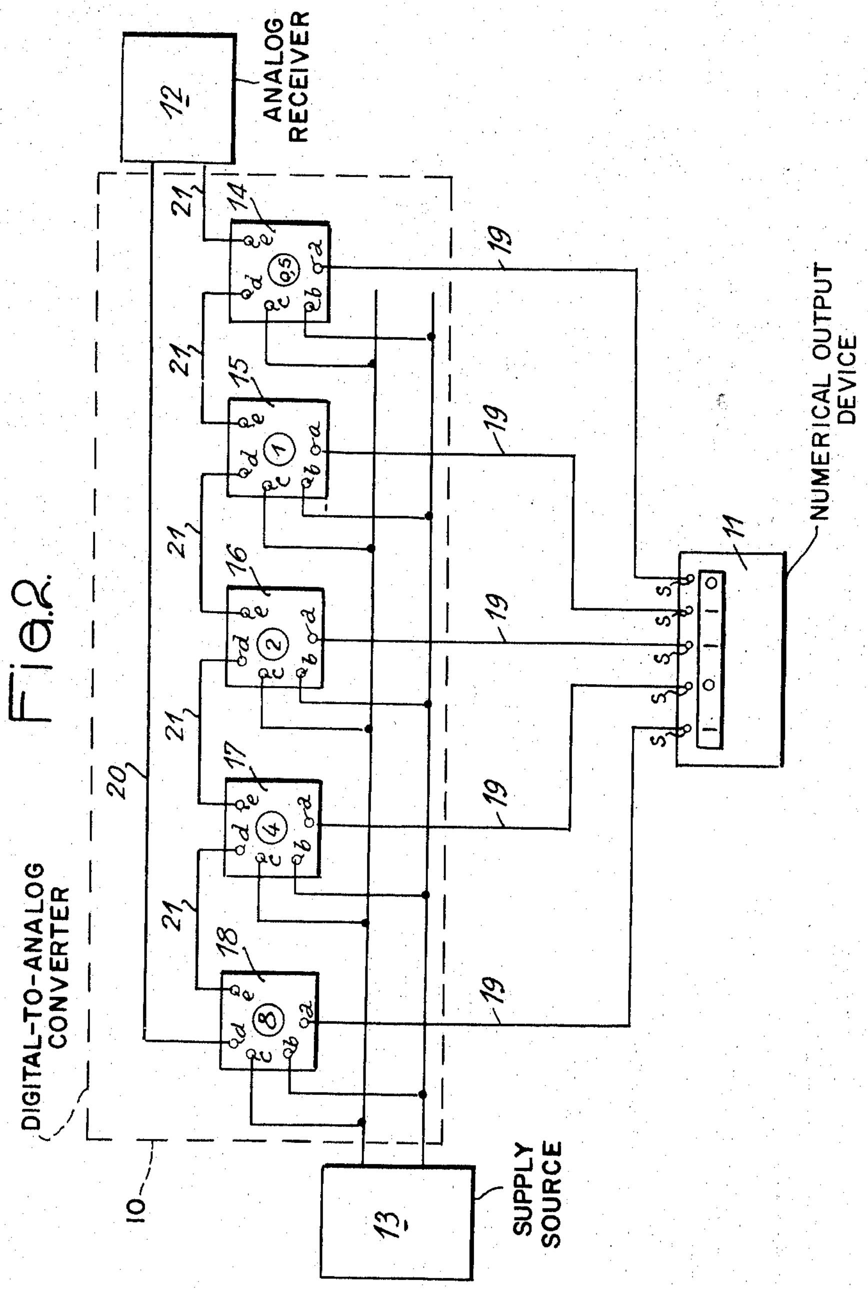
FIG. 2 shows a circuit diagram partially in block form and partially schematic of the installation of FIG. 1.

FIG. 2 shows the converter 10 in the form of a five bit digital-to-analogue converter, the bits having weights in the ratio $2^{-1}$, $2^0$, $2^1$, $2^2$, $2^3$ provided by five cells or networks 14 to 18, respectively, corresponding to these various weights. The number of bits which can be handled by the converter has been shown as equal to five, but any number of bits can, of course, converted in accordance with the present invention. Further, the ratio between the bits can be different from those mentioned, the only constraint being that the bits have different weights and that combinations of the same be also different.

Each of the cells has a control input *a* connected by wires 19 to an output *s* of the computer 11 and receives operating potential at terminals *b* and *c* from a supply line of the alternating voltage source 13. The output terminals *d* and *e* of each cell are connected in series by a two-wired line 20–21 to receiver 12.

As it has been explained above, each cell corresponds, for example, to weights in the ratio of $2^{-1}$, $2^0$, $2^1$, $2^2$, $2^3$, which indicates that according to the invention, each cell receiving on its input *a* a signal from the computer over wire 19 provides, between its output terminals *d–e*, an alternating voltage which is synchronous and in phase with the supply source 13, and proportional to such weight. If, on the contrary, a zero signal comes from the computer on the control input *a* of a cell, the cell provides at its output, an alternating voltage which is synchronous, in opposition of phase with the supply source 13, and proportional to such weight. In the presently described embodiment, the proportionality coefficient is equal to 1, and the output voltages of cells 14 to 18 respectively correspond to: 0.5–1–2–4–8 volts in phase or in opposition of phase depending on whether the corresponding output of the computer 11 is in a state 1 or in a state 0.

The geometrical sum of the alternating voltages on the line 20–21, which sum is the voltage applied to the receiver 12, is thus an analogue representation of the digital or numerical number appearing at the output of the computer 11 or more generally of any device having a digital or numerical output. The following table shows typical voltages obtained for various digital signals fed to the converter. For the sake of simplicity, the output voltage is noted as positive when in phase with the supply source 13 and negative when in opposition of phase with the supply source 13.

TABLE

| | Cell 18 | Cell 17 | Cell 16 | Cell 15 | Cell 14 | Decimal number | Output voltage on wires 21–22 |
|---|---|---|---|---|---|---|---|
| | 8 | 4 | 2 | 1 | 0.5 | | |
| Input digital number | 0 | 0 | 0 | 0 | 0 | 0 | |
| output corresponding voltage | −8 | −4 | −2 | −1 | −0.5 | | −15.5 |
| | 0 | 0 | 0 | 0 | 1 | 1 | |
| | −8 | −4 | −2 | −1 | +0.5 | | −14.5 |
| | 0 | 0 | 0 | 1 | 0 | 2 | |
| | −8 | −4 | −2 | +1 | −0.5 | | −13.5 |
| | 0 | 1 | 1 | 1 | 1 | 15 | |
| | −8 | +4 | +2 | +1 | +0.5 | | −0.5 |
| | 1 | 1 | 0 | 1 | 1 | 27 | |
| | +8 | +4 | −2 | +1 | +0.5 | | +11.5 |
| | 1 | 1 | 1 | 1 | 1 | 31 | |
| | +8 | +4 | +2 | +1 | +0.5 | | +15.5 |

On the above table are shown the different cells with their corresponding weights, for each bit of a five digit binary number entering the respective cells of the converter, the corresponding output analogue voltages, as well as the total voltage applied to the line 20–21 and read on the receiver 12. The decimal input corresponding to the digital binary number has also been shown.

Figure 3:
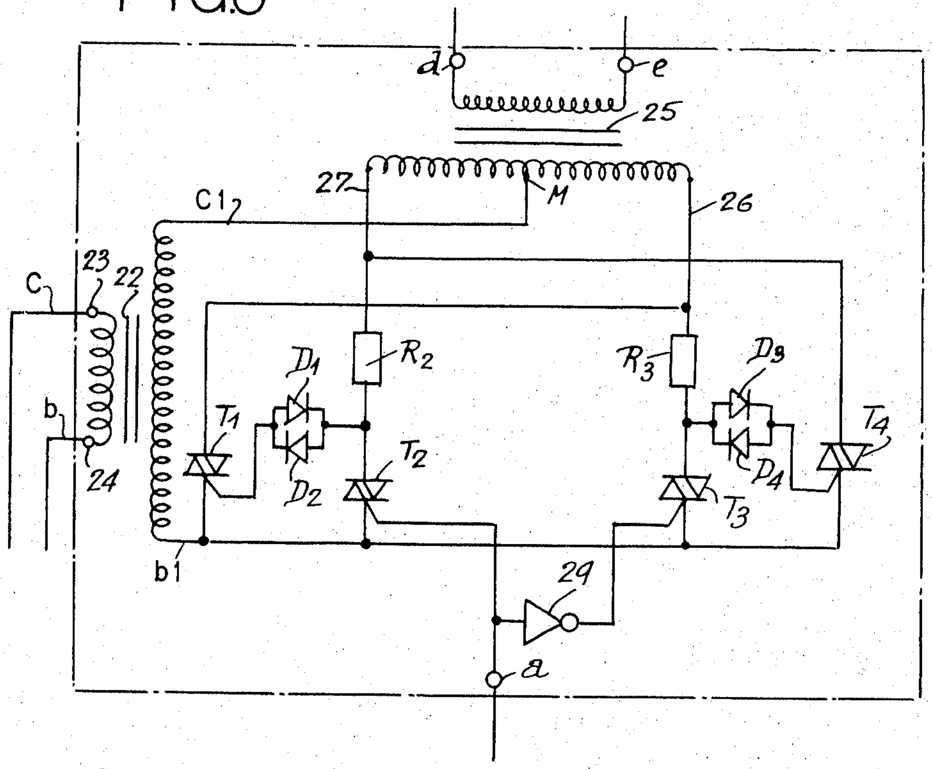
FIG. 3 shows a preferred embodiment of a portion of the converter of FIG. 2.

One of the elementary cells 14 to 18 is represented in FIG. 3 which illustrates the control terminal *a*, the alternating supply terminals *b* and *c* and also the output terminals *d* and *e*.

Supply terminals *b*1 and *c*1 constitute the terminals of the secondary winding of a transformer 22, the primary winding thereof comprising terminals 23 and 24 connected to terminals b and c of the supply source of alternating current 13. The terminal *c*1 is connected to the middle point M of the primary winding of a transformer 25 of which the secondary winding comprises the output terminals *d* and *e* of the cell. The converter further comprises four triacs T1 – T2 – T3 – T4.

The triacs are bi-directional tyristors provided with a control electrode enabling the establishment of a flow of current in one direction or in the opposite direction, the triac remaining in a conducting state until the current therethrough becomes zero.

Each of the triacs T1 to T4 have their cathode electrodes connected to the terminal *b*1 of the alternating voltage supply source. The anodes of the triacs T1 and T4 are respectively connected to the two terminals 26 and 27 of the transformer 25, while the anodes of triacs T2 and T3 are connected to the two terminals 27 and 26 through calibrated resistances R2 and R3, respectively. The control electrodes of the triacs T1 and T4 are connected to the respective anodes of the triacs T2 and T3 by bridges of parallel, oppositively poled diodes D1 – D2 and respectively D3 – D4. Thus, each of the electrodes is connected with one of terminals 27 and 26 respectively, of transformer 25 through a parallel diode and a resistance.

The control electrode of the triac T2 is directly connected to the control terminal *a* while the control electrode of triac T3 is connected to terminal *a* through an inverter or NOT circuit 29 in such a way that, for a given signal applied on the terminal *a*, the signal directly gates the control electrode of the triac T2 while the complementary of said signal gates the electrode of the triac T3.

The elementary cell described in FIG. 3 operates as follows.

The alternating supply voltage is applied between the terminals *b* and *c*. The in phase triac T4, when it is conducting, causes an alternating voltage to appear at the terminals *d* and *e* of the secondary winding of the transformer 25. This voltage has an amplitude determined by the supply voltage at the terminals *b* and *c* and also by the transformation ratio of the transformer 25.

For example, for a cell having a binary weight of 1 i.e., the cell 15 of FIG. 2, an effective alternating voltage of 1 volt is desired between the output terminals *d* and *e*. For that purpose, the ratios of the transformers 22 and 25 must be selected so as to obtain such an alternating voltage between the terminals *d* and *e*. When the terminals *b*1 and *c*1 of all the cells of FIG. 2 are directly fed from a common voltage source equal for example to 110 volts, only the ratio of the transformer 25 need be determined.

When the phase opposition triac T1 is conducting, at the terminals $d-e$ is obtained a voltage of the same amplitude as above, but of opposite phase. That is true since by construction, the terminal *c* is connected to the middle point M of the secondary winding of the transformer 25.

It is noted that, if the triac T4 is conducting, the alternating voltage between the terminals 26 and 27 is equal to double the supply voltage between the terminals *b* and *c*, which causes the correct supply of the control electrode of the triac T4 through the resistance R3 and through the bridge of diodes D3–D4.

The control of the cell is obtained by applying a control signal on the terminal *a*. It is said to apply a level 0 (binary state 0) when the corresponding output *s* of the computer 11 is at a state 0, on the contrary it is said to apply a level 1 (binary state 1) when the corresponding output *s* of computer 11 is of a state 1.

The control signal applied on the control terminal *a* is then fed directly to the control electrode of the auxiliary triac T2, and on the other hand, on the auxiliary triac T3 after passing through the inverter 29.

Applying a level 1 on the terminal *a* causes conduction of the triac T2. Thus, the control electrode of the triac T1 receives a zero voltage, and T1 assumes a non-conducting state.

The control electrode of the triac T3 receives at this moment a zero signal, such that the triac T3 also assumes a non-conducting state.

The current passing through the resistance R2 provides a voltage between the terminal 26 of the transformer 25 and the terminal *b*. Therefore, a current passes from the terminal 26 through the resistance R3, the bridge of diodes D3–D4 and the control electrode of the triac T4, causing the same to become conductive.

On the contrary, applying a level 0 on the terminal *a* causes a level 1 to appear on the control electrode of the triac T3 which consequently becomes conductive, causing the control current passing through the control electrode of the triac T4 to become zero. The triac T4 becomes non-conductive as soon as the current passing through it becomes null. Thereafter, as a consequence of the passage of a current into the resistance R3 due to the conduction of the triac T3, a voltage appears between the terminal 27 of the transformer 25 and the terminal *b*. Thus, a current circulates from the terminal 27, through the resistance R2, the bridge of diodes D1–D2, towards the control electrode of the triac T1 which becomes conductive.

To summarize, the triac T4 conducts when the control terminal a is at a level 1, and the triac T1 conducts when the control terminal is at a level 0, the transformation in conduction state from one to the other triac occurs when the current passing through the same becomes null while ensuring that the two triacs cannot, in any case, be conductive at the same time.

Thus is provided an elementary cell or network delivering a predetermined voltage signal in phase when the control is at a level 1 and in opposition of phase when the control current is at a level 0. In other words, each output of the elementary cell of FIG. 3 is at $+$ P (where P is the predetermined voltage signal level) when the control is at a level 1, and is at $-$ P when the control is at a level 0.

It has been assumed hereinabove that the weight of the cell represented in FIG. 3 was equal to 1. It is obvious that any value could be obtained by an appropriate selection of the winding ratio of the transformer 25, and eventually also of the transformer 22. It is therefore possible to obtain in each of the five cells 14 to 18 of FIG. 2, each of them being similar to the cell of FIG. 3, output voltages corresponding to 0.5 – 1 – 2 – 4 – 8 volts with the sign + or the sign − depending on whether the corresponding output of the computer 11 to which the elementary cell is connected is at a state 1 or at a state 0.

If reference is made both to FIGS. 2 and 3 it seems necessary to provide as many supply transformers such as the transformer 22 and as many output transformers such as the transformer 25 that exist elementary cells in the diagram of FIG. 2. Such an embodiment would lead to a heavy and expensive construction, and the embodiment according to FIG. 4 provides a more compact embodiment circuit.

Figure 4:
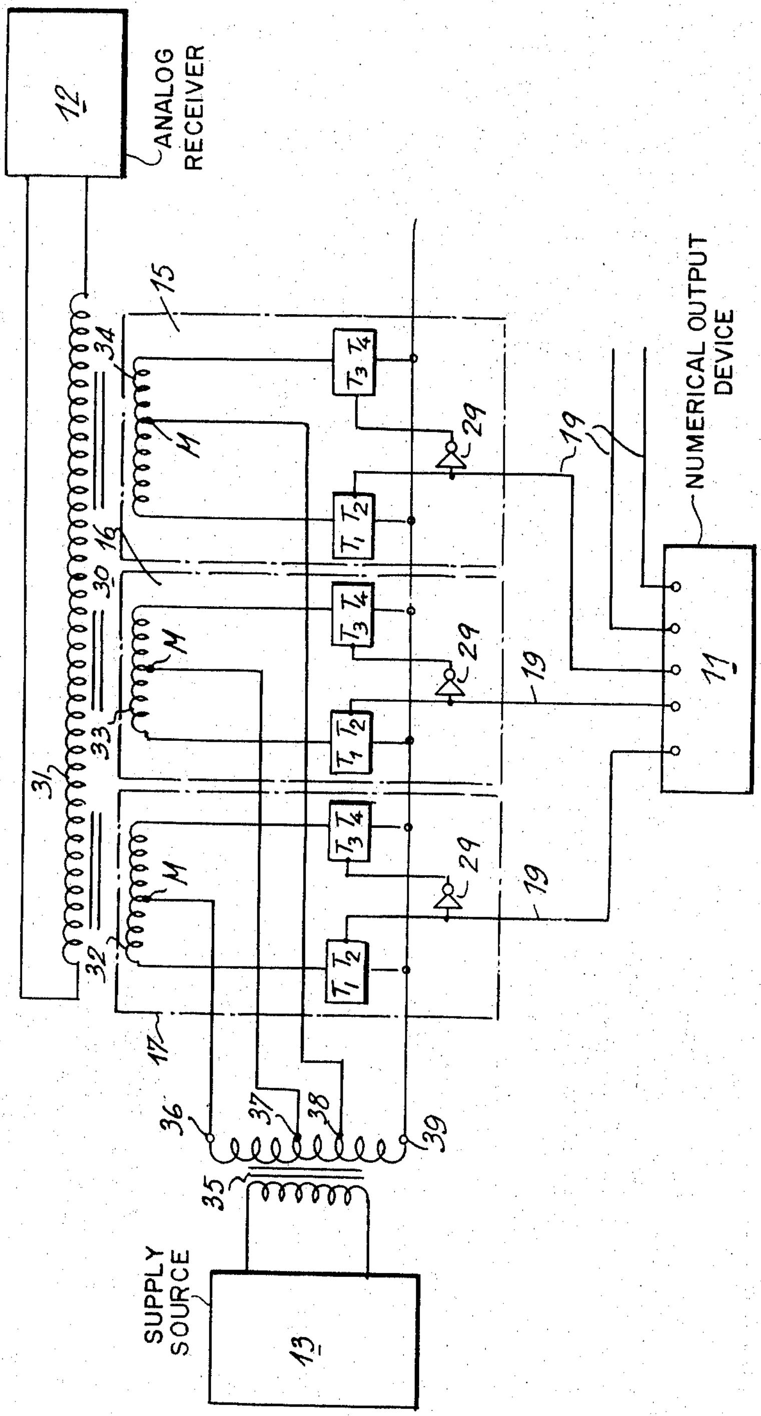
FIG. 4 shows a preferred embodiment of the converter of FIG. 2.

In FIG. 4, only three cells such as cells 15, 16, 17 of FIG. 2, are shown. Each of these cells comprises as in FIG. 3 the two circuit halves with triacs T1, T2 on one hand and T3, T4 on the other hand, respectively controlled directly from the control terminal *a* and through the inverter 29.

The particular advantage of this circuit results from the provision of a single output transformer 30 acting as the transformer 25 of FIG. 3. The output transformer 30 comprises only one secondary winding 31 connected to the receiver 12 and a plurality of magnetic circuits each comprising a primary winding having terminals connected to the corresponding triac as in FIG. 3. Each primary magnetic circuit has a winding 32, 33, 34 respectively, with a median tap M and each has the same number of turns. The sections of the magnetic circuits are in the ratio 1, 2 and 4 respectively for the cells 15, 16 and 17 of weights 1, 2 and 4.

The supply transformer connected to the supply source 13 acts as the transformer 22 of FIG. 3 and is referenced as 35. The transformer 35 is constituted of only one primary winding and of one secondary winding comprising several taps 36, 37, 38 while the first terminal 39 of said winding is connected to all the anodes of the triacs as in FIG. 3.

The tap 36 is at the opposite end of the secondary winding of the transformer 35, the tap 37 is in the middle of the secondary winding, and the tap 38 is located a quarter of the secondary winding from terminal 39. The taps 36, 37, 38 are respectively connected to the middle point M of the primary windings 32, 33, 34. Thus the cell 17 of a weight 4 is fed by all the voltage between terminals 36 and 39, the cell 16 of a weight 2 is fed by half of this voltage and the cell 15 of a weight 1 is fed by a quarter of the voltage.

Thus a converter unit can be provided comprising any number of cells of different weights with only one output secondary winding and various primary windings comprising the same number of turns but fed or supplied in a weighted manner, to thereby simplify the overall magnetic circuit of the converter.

Figure 5:
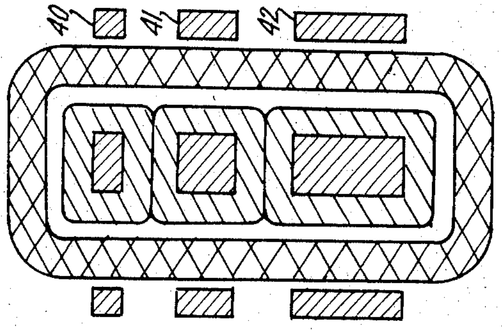
FIG. 5 is a cross sectional view of the transformer of the converter of FIG. 4.

In FIG. 5 is represented an advantageous embodiment of the output transformer of the device wherein the sections of the different magnetic circuits referenced as 40, 41, 42 are in the ratio: 1, 2, 4; that is in the weight ratio of the different cells 15, 16, 17.

Figure 6:
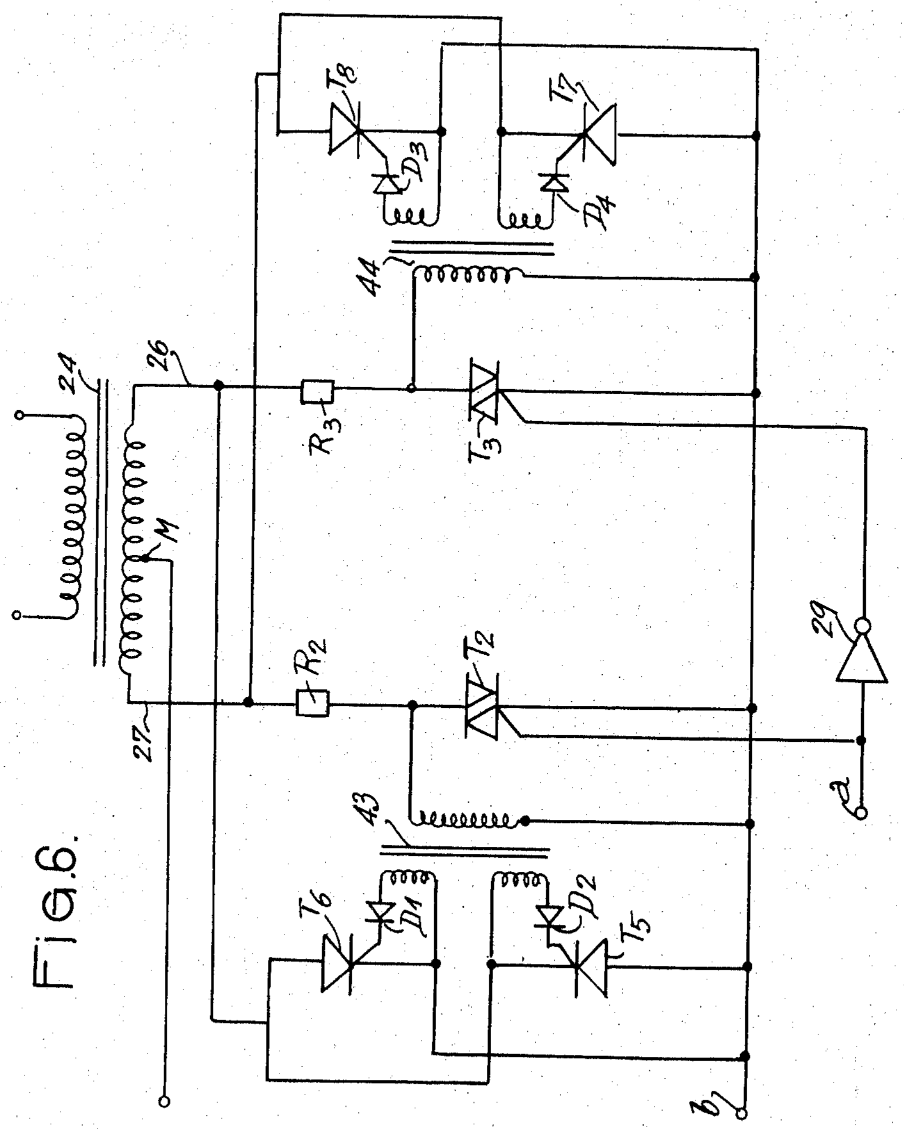
FIGS. 6 and 7 show two modifications of the embodiment of FIG. 3.

In FIG. 6 is represented a modification of an elementary cell described previously with reference to FIG. 3. All the elements and operations are similar, with the exception that triac T1 is replaced by two thyristors T5, T6 and triac T4 is replaced by two thyristors T7, T8. The group of thyristors T5 – T6 (replacing the triac T1) is placed top to bottom. The control electrode of each tyristor is supplied through a secondary winding of an auxiliary transformer 43, the primary thereof being connected in shunt across the triac T2. Also the set of thyristors T7–T8 (which replace the triac T4) is placed top to bottom. The control electrode of each thyristor is supplied through a secondary winding of a transformer 44, the primary thereof being connected in shunt on the triac T3.

Figure 7:
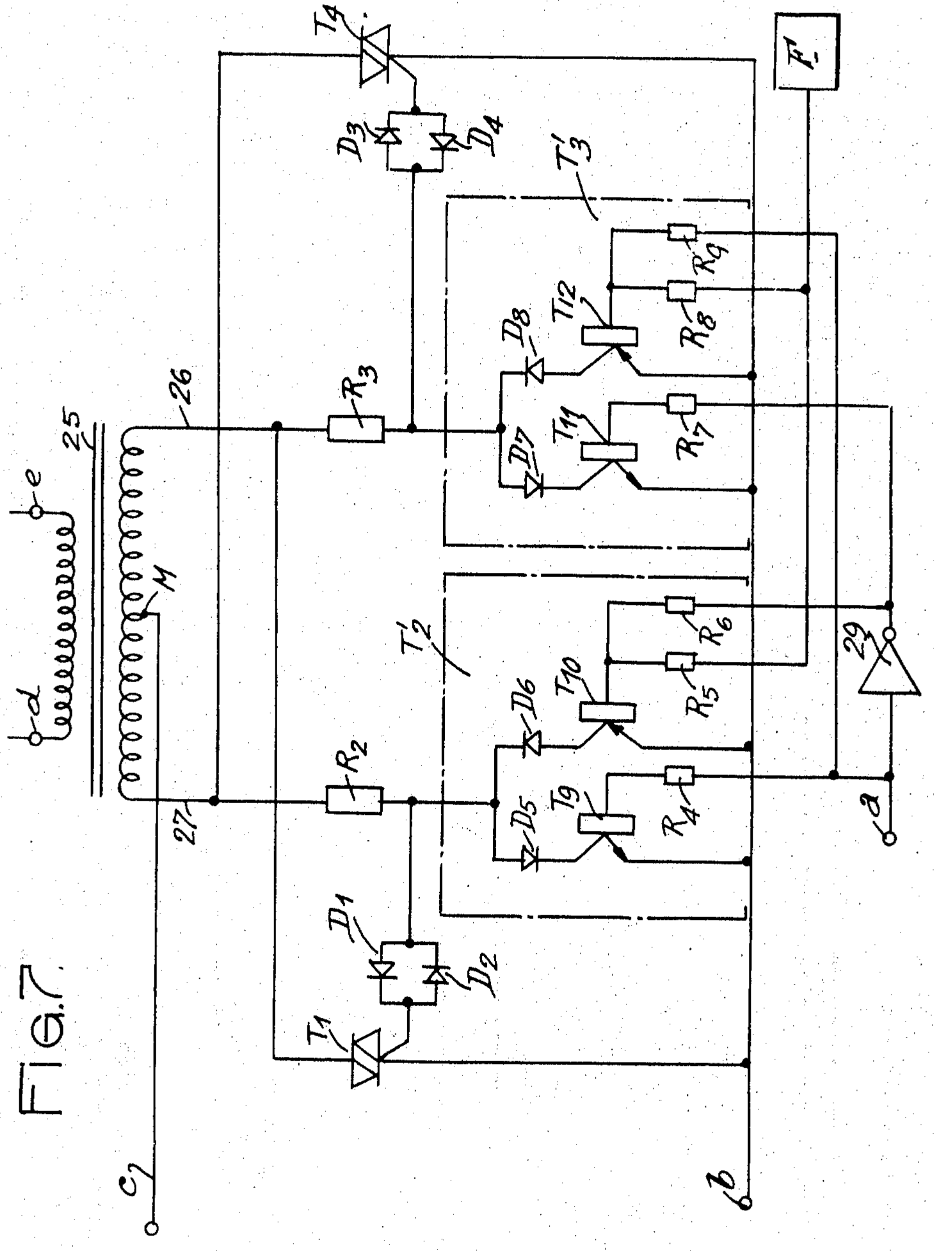

In FIG. 7 is represented still another embodiment of the elementary cell of FIG. 3 wherein instead of utilizing the auxiliary triacs T2 and T3 are used transistorized units T'2, T'3.

Only the units T'2, T'3 will be described below, the remaining part of the circuit diagram being similar to that of FIG. 3.

The unit T'2 comprises a transistor T9 of the NPN type and a transistor T10 of the PNP type, the collectors thereof are connected by diodes D5 and D6, respectively, at the common point of the resistance R2 and of the bridge of diodes D1–D2. The emitters of the transistors T9, T10 are directly connected to the supply terminal *b*, while the base of the transistor T9 is connected to the control terminal *a* by a resistance R4 and the base of the transistor T10 is connected, on one hand by a resistance R5 to an auxiliary source of negative voltage F of −10 volts and, on the other hand, by a resistance R6 to the output of the inverter 29.

The unit T'3 is symmetrical to the unit T'2 and comprises a transistor T11 of the NPN type and a transistor T12 of the type PNP, the collectors thereof being connected by diodes D7 and D8, respectively, to the common point of the resistance R3 and of the bridge of diodes D3–D4. The emitters of the transistors T11, T12 are directly connected to the terminal *b*, while the base of the transistor T11 is connected by a resistance R7 to the output of the inverter 29 and the base of the transistor T12 is connected, on one hand, by a resistance R8 to the source F and, on the other hand, by a resistance R9 to the control terminal *a*.

The operation of the elementary cell represented in FIG. 7 is as follows. The alternating supply voltage is applied between the terminals *b* and *c*. The in phase triac T4 causes, when it is conductive, an alternating voltage to appear at terminals *d* and *e* of the secondary winding of the transformer 25. Said voltage has an amplitude determined by the amplitude of the supply voltage at the terminals *b* and *c* and also by the transformation ratio of the transformer 25. On the contrary when the phase opposition triac T1 is conductive, at terminals d–e is obtained a voltage of the same amplitude but of opposite phase. This is due to the connection of terminal *c* to the middle point M of the primary winding of the transformer 25. The control of the cell is obtained by applying a control signal on the terminal *a*. When said signal is at a level 1, it causes the conduction of the transistors T9 and T10, and the blocking of the transistors T11–T12.

More specifically, a positive signal applied to the terminal *a* feeds the base of the transistor T9 through the resistance R4. Said signal causes at the output of the inverter 29 a level 0. The base of the transistor T10 is then connected to the source F of negative voltage (−10 volts). At the same time a positive voltage applied to the terminal *a* determines a positive potential on the base of the transistor T12, while the zero voltage at the output of the inverter 29 determines a zero potential at the base of the transistor T11. Consequently, the transistors T11–T12 are blocked. The transistors T9–T10 being conducting, the control electrode of the triac T1 is not supplied with a signal and said triac is open. On the contrary, the transistors T11 and T12 being blocked, the control electrode of the triac T4 is fed by the potential available at the terminal 26 of the transformer 25, through the resistance R3 and the diodes D3–D4. Applying a signal 0 on the control terminal *a* causes the reverse operation of the unit, the operation being otherwise similar to the sequence described in relation with FIG. 3.

Figure 8:
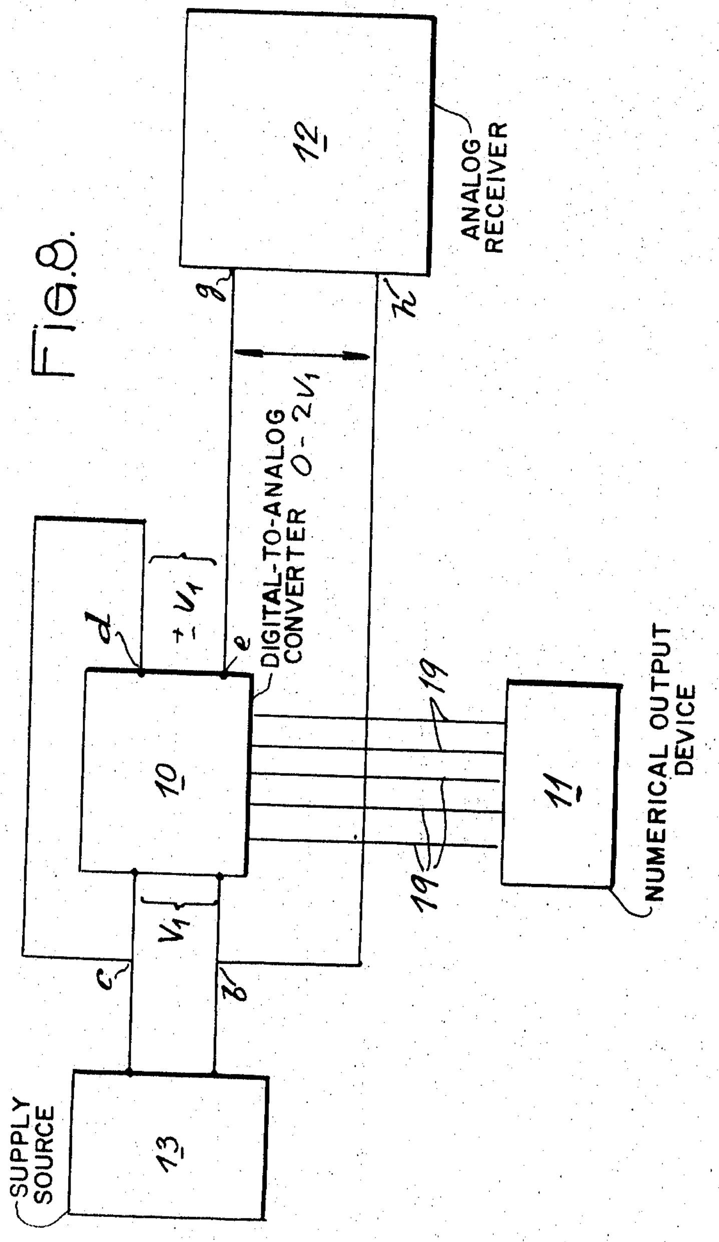
FIG. 8 is a diagrammatic view of an installation using the converter of the invention.

FIG. 8 illustrates a preferred utilization of the digital-to-analogue converter 10 of the present invention. In this embodiment is desired to provide to the input of the analogue receiving apparatus 12, a voltage varying between 0 and an increasing voltage, whereby the voltage 0 corresponds to the binary number 0 coming from computer 11, and increasing voltages will correspond to binary numbers increasing from 0.

Consequently, the transformers of each of the elementary cells are determined in such a way that the maximum binary number from the computer 11, which indicates the sum of the different bits, corresponds exactly with the value of voltage $V_1$ delivered by the alternating voltage source 13. Thus will be obtained at the output terminals *d–e* of the converter 10 to a voltage which is in phase or in opposition of phase with the alternating voltage $V_1$ of source 13.

The output terminal *d* is connected to the input terminal *c*. There is thus provided, between the output terminal *e* and the input terminal *b*, the geometrical sum of the supply voltage delivered by the alternating source 13 and the output voltage of the converter 10. This voltage is directly applied to terminals *g* and *h* of the receiver 12 and varies between 0 and 2 $V_1$, proportionally to the number represented by the binary signal from the computer 11.

It is thus possible to realize any voltage combinations between the source 13 and the output of the converter 10 to obtain at the input of the receiver 12 an alternating voltage varying between limits arbitrarily selected and reponsive to the numerical or digital output from the computer 11.

The present invention is not restricted to the embodiments shown and described in detail, for various modifications thereof can moreover be applied to it without departing from the scope of the invention as shown by the appending claims.

I claim:

1. A device for converting signals representative of binary data into an alternating voltage representative of analogue data corresponding to said binary data, said device comprising:

a plurality of conversion networks, each having an input terminal adapted to receive one of the binary data signals, supply means adapted to be connected with a source of alternating current operating potential and having a pair of output supply terminals, and a transformer primary winding having first and second end terminals and a tap therebetween, one of said pair of supply terminals connected directly to said tap and the other of said pair of supply terminals connected to an inversing circuit;

said inversing circuit connected with said input terminal and responsive to the binary state of the signals thereon for coupling said other supply terminal to one of said first and second end terminals, respectively, of said winding causing said winding to be supplied with an alternating current signal in phase synchronization or phase opposition, respectively, said inversing circuit including first and second semi-conductor switching networks connected between said other supply terminal and said first and second winding end terminals, respectively, a control electrode of one of said networks connected directly with said input terminal and a control electrode of the other network connected to said input terminal through a phase inverter; and an output winding circuit electromagnetically coupled to said transformer primary windings of each of said conversion networks for providing a composite output analogue voltage having a component from each of said primary windings, said supply means and said primary and secondary windings cooperating to provide a different transformation weight for each conversion network corresponding to the binary weight of its associated binary data input signal.

2. A device as set forth in claim 1 wherein said supply means of each of said conversion networks comprises a transformer circuit having a transformation ratio proportional to the given weight of its associated binary data input signal.

3. A device as set forth in claim 2 wherein said transformer circuit includes a common primary winding connected to a source of alternating current and a common secondary winding having a plurality of taps connected, respectively, to each of said conversion networks and positioned to establish the appropriate transformation ratio for each of said networks.

4. A device as set forth in claim 1 wherein said supply means comprises a direct connection of said pair of supply terminals to a source of alternating current operating potential, and wherein the transformation ratio between each said primary winding and said secondary transformer winding is weighted in proportion to a given weight of its associated binary data input signal.

5. A device as set forth in claim 4 wherein each conversion network comprises a primary winding having the same number of turns, and wherein said primary windings and said secondary windings are coupled by a magnetic circuit having plural sections each proportional to the given weight of a binary input data signal.

6. A device as set forth in claim 1 wherein each of said semi-conductor switching networks comprises first and second triacs; the anode electrode of said first triac connected with the control electrode of said second triac through a diode bridge and further connected to one end terminal of said primary winding; the anode of said second triac connected with the other end terminal of said primary winding; the cathodes of both triacs connected with said supply means; and the control electride of said first triac coupled with said input terminal.

7. A device as set forth in claim 1 wherein each of said semi-conductor switching networks comprises a triac and a pair of controlled solid state switches.

8. A device as set forth in claim 7 wherein said solid state switches comprise transistor devices.

9. A device as set forth in claim 8 wherein said transistors of each pair are of opposite conductivity type.

10. A device as set forth in claim 7 wherein said solid state switches comprise thyristor devices.

11. A device as set forth in claim 1 further including means connecting said output transformer winding in series with said source of alternating current.

* * * * *